(12) United States Patent
Zhao et al.

(10) Patent No.: US 10,345,651 B2
(45) Date of Patent: Jul. 9, 2019

(54) DISPLAY PANEL AND DISPLAY DEVICE

(71) Applicant: WUHAN CHINA STAR OPTOELECTRONICS TECHNOLOGY CO., LTD., Wuhan, Hubei (CN)

(72) Inventors: Kaixiang Zhao, Hubei (CN); Zhandong Zhang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 25 days.

(21) Appl. No.: 15/539,812

(22) PCT Filed: May 18, 2017

(86) PCT No.: PCT/CN2017/084860
§ 371 (c)(1),
(2) Date: Jun. 26, 2017

(87) PCT Pub. No.: WO2018/196059
PCT Pub. Date: Nov. 1, 2018

(65) Prior Publication Data
US 2018/0348570 A1 Dec. 6, 2018

(30) Foreign Application Priority Data
Apr. 24, 2017 (CN) .............................. 2017 1 026909

(51) Int. Cl.
G02F 1/1339 (2006.01)
G02F 1/1335 (2006.01)
G02F 1/1362 (2006.01)
G02F 1/1337 (2006.01)
H01L 27/12 (2006.01)

(52) U.S. Cl.
CPC .......... *G02F 1/1339* (2013.01); *G02F 1/1337* (2013.01); *G02F 1/133512* (2013.01); *G02F 1/136286* (2013.01); *H01L 27/124* (2013.01); *G02F 1/133514* (2013.01); *G02F 2001/13396* (2013.01); *G02F 2001/13398* (2013.01)

(58) Field of Classification Search
CPC ....................... G02F 1/133514; G02F 1/1339
See application file for complete search history.

(56) References Cited

U.S. PATENT DOCUMENTS

| | | | |
|---|---|---|---|
| 2010/0090992 A1* | 4/2010 | Lee | G09G 3/3688 345/204 |
| 2011/0134053 A1* | 6/2011 | Kao | G06F 3/0412 345/173 |

* cited by examiner

Primary Examiner — Edmond C Lau

(57) ABSTRACT

Disclosed is a display panel and a display device. The display panel includes an array substrate, a color filter substrate and a liquid crystal layer. A plurality of parallel gate lines is disposed on the array substrate. The liquid crystal layer is disposed between the array substrate and the color filter substrate. The liquid crystal layer has a thickness gradually decreasing along a direction from an output near-end to an output far-end of the gate line. Display uniformity of a panel can be improved by the display panel and the display device.

12 Claims, 3 Drawing Sheets

DISPLAY PANEL AND DISPLAY DEVICE

CROSS-REFERENCE TO RELATED APPLICATIONS

This application claims the priority of Chinese patent application CN 201710269609.2, entitled "Display panel and display device" and filed on Apr. 24, 2017, the entirety of which is incorporated herein by reference.

FIELD OF THE INVENTION

The present disclosure relates to the technical field of display, and in particular, to a display panel and a display device.

BACKGROUND OF THE INVENTION

When a liquid crystal display device displays images, switching of each frame of image is achieved by scanning of scanning lines.

Since scanning lines are made of metal materials which have resistance, a voltage on a scanning line decreases with increase of a transmission distance. This phenomenon is called a voltage drop. As shown in FIG. 1, with increase of distances from an input end of a gate line to a pixel A, to a pixel B, and to a pixel C, voltage drops increase.

Specifically, an expression of the voltage drop on a gate line in an existing liquid crystal display panel is as follows:

$$\Delta Vp = \frac{C_{gs}}{C_{gs} + C_{lc} + C_s} * V_{ghl},$$

where $\Delta Vp$ represents a voltage drop value, $C_{gs}$ represents a capacitance between a gate line and a source/drain of a switching element, $C_{lc}$ represents a liquid crystal capacitance, $C_s$ represents a storage capacitance, and $V_{ghl}$ represents a difference between an ideal input voltage and an actual input voltage.

FIG. 2 schematically shows voltage drops at the pixel A, the pixel B, and the pixel C. With the increase of distances from the pixel A, the pixel B, and the pixel C to the input end of the gate line (i.e., distances from the pixel A, the pixel B, and the pixel C to a scanning signal driving circuit increase), voltage drops increase, i.e., $V_a < V_b < V_c$. In FIG. 2, $V_a$ represents a voltage drop at the pixel A, and $\Delta V_a$ represents a feedthrough voltage at the pixel A; $V_b$ represents a voltage drop at the pixel B, and $\Delta V_b$ represents a feedthrough voltage at the pixel B; $V_c$ represents a voltage drop at the pixel C, and $\Delta V_c$ represents a feedthrough voltage at the pixel C; and $V_{gh}$ represents an ideal input voltage on the gate line. It is known from the above expression of the voltage drop on a gate line that the presence of $\Delta Vp$ can cause an image to be relatively bright at a part thereof close to the input end of the gate line and relatively dark at a part thereof far from the input end of the gate line, which affects display uniformity of a panel.

SUMMARY OF THE INVENTION

In order to solve the above problem, the present disclosure provides a display panel and a display device for improving display uniformity of a panel.

According to one aspect of the present disclosure, a display panel is provided. The display panel comprises an array substrate, a color filter substrate and a liquid crystal layer. A plurality of parallel gate lines is disposed on the array substrate. The liquid crystal layer is disposed between the array substrate and the color filter substrate. The liquid crystal layer is configured to have a thickness gradually decreasing along a direction from an output near-end to an output far-end of the gate line.

According to one embodiment of the present disclosure, the display panel further comprises spacers which are disposed between the array substrate and the color filter substrate. The spacers are configured to have heights gradually decreasing along the direction from the output near-end to the output far-end of the gate line.

According to one embodiment of the present disclosure, the spacers are formed by irradiating a negative photoresist through a photomask provided thereon with chromium films. The chromium films have various thicknesses and are disposed at preset light-transmitting positions.

According to one embodiment of the present disclosure, the spacers are formed by adjusting quantities of a spacer material sprayed at preset positions on the color filter substrate, or the spacers are formed by adjusting distances between a nozzle for spraying the spacer material and the preset positions on the color filter substrate or adjusting speeds at which the nozzle sprays the spacer material.

According to one embodiment of the present disclosure, the display panel further comprises a black matrix which is disposed on the color filter substrate. The black matrix is configured to have a thickness gradually increasing along the direction from the output near-end to the output far-end of the gate line.

According to one embodiment of the present disclosure, the black matrix is formed by adjusting a quantity of a black matrix material sprayed at a preset position on the color filter substrate, or the black matrix is formed by adjusting a distance between a nozzle for spraying the black matrix material and the preset position on the color filter substrate or adjusting a speed at which the nozzle sprays the black matrix material.

According to one embodiment of the present disclosure, the display panel further comprises a first alignment layer and a second alignment layer. The first alignment layer is disposed at a side of the array substrate close to the liquid crystal layer, and the second alignment layer is disposed at a side of the color filter substrate close to the liquid crystal layer. The first alignment layer or the second alignment layer is configured to have a thickness gradually increasing along the direction from the output near-end to the output far-end of the gate line.

According to one embodiment of the present disclosure, the first alignment layer or the second alignment layer is formed by transferring an alignment material to the array substrate or the color filter substrate with a printing plate, which is provided thereon with holes of various sizes.

According to one embodiment of the present disclosure, the holes on the printing plate are configured to have sizes gradually decreasing along the direction from the output near-end to the output far-end of the gate line.

According to another aspect of the present disclosure, a display device is provided. The display device comprises the abovementioned display panel.

The present disclosure has the following beneficial effects. By arranging the thickness of the liquid crystal layer to gradually decrease along the direction from the output near-end to the output far-end of the gate line, the voltage drop of a scanning signal can be kept constant along the direction from the output near-end to the output far-end of the gate line. Thus, voltages output from respective parts of a panel can become uniform, and the display uniformity of the panel can be improved.

Other advantages, objectives and features of the present disclosure will be further explained in the following description, and will partly become self-evident for those skilled in the art based on a study of the following text, or teachings can be obtained through an implementation of the present disclosure. The objectives and other advantages of the present disclosure will be achieved and obtained through structures specifically pointed out in the description, claims, and accompanying drawings.

BRIEF DESCRIPTION OF THE DRAWINGS

The accompanying drawings provide further understandings of the present disclosure or the prior art, and constitute one part of the description. The drawings are used for explaining the technical solution of present disclosure together with the embodiments, not for limiting the present disclosure. In the drawings.

DETAILED DESCRIPTION OF THE EMBODIMENTS

The implementation manner of the present disclosure will be explained in detail below with reference to the accompanying drawings and embodiments, so that one can fully understand how the present disclosure solves the technical problem and achieves the technical effects through technical means, thereby implementing the same. It should be noted that as long as there is no structural conflict, any of the embodiments of the present disclosure and any of the technical features of the embodiments may be combined with one another, and the technical solutions obtained therefrom all fall within the scope of the present disclosure.

Figure 1:
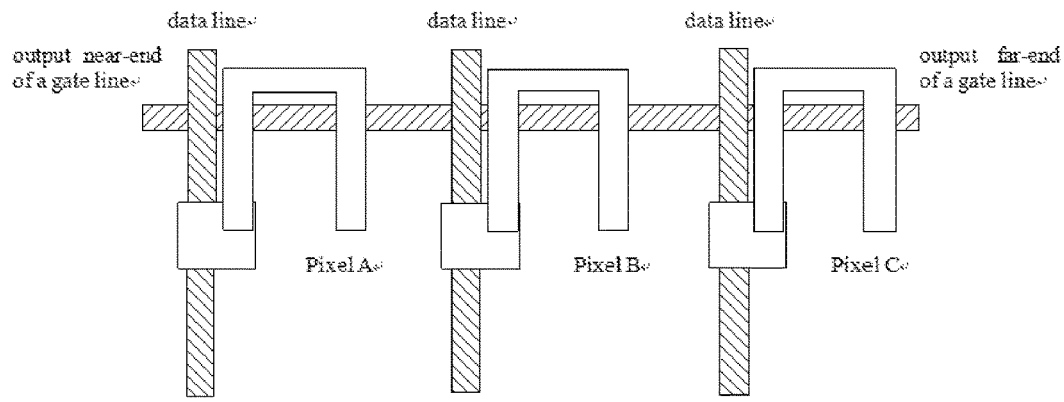
FIG. 1 schematically shows a wiring arrangement on an array substrate in the prior art.
Figure 2:
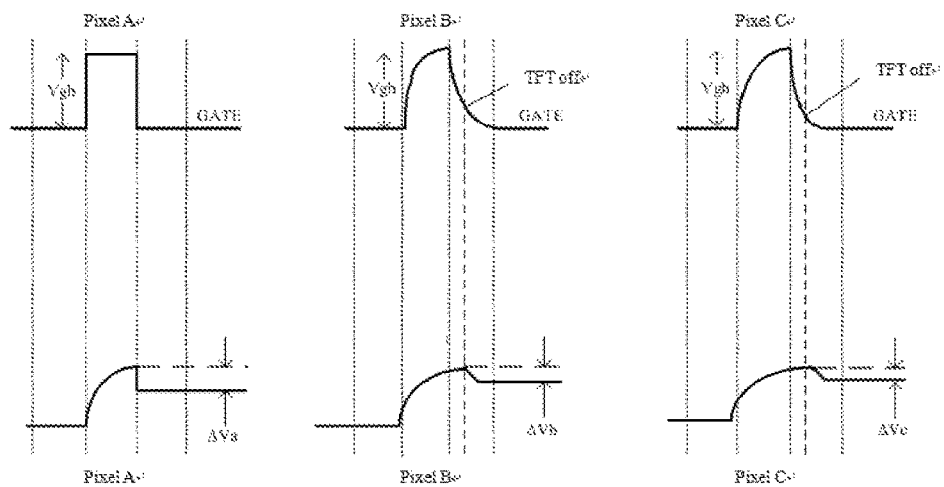
FIG. 2 schematically shows waveforms of driving voltages of respective pixels shown in FIG. 1.
Figure 3:
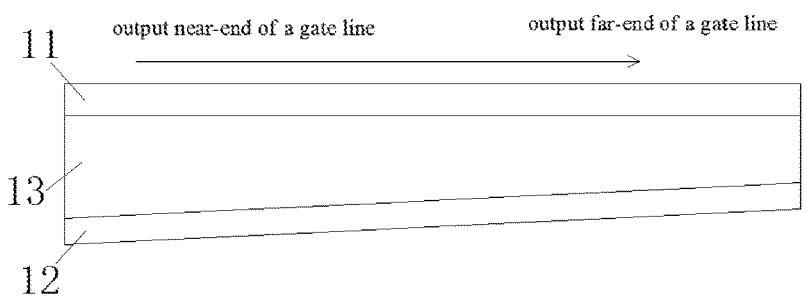
FIG. 3 schematically shows a structure of a display panel according to one embodiment of the present disclosure.

As shown in FIG. 3, the present disclosure provides a display panel. The display panel comprises an array substrate 11, a color filter substrate 12, and a liquid crystal layer 13. A plurality of parallel gate lines (not shown in FIG. 3) is disposed on the array substrate 11. The liquid crystal layer 13 is disposed between the array substrate 11 and the color filter substrate 12. The liquid crystal layer is configured to have a thickness gradually decreasing along a direction from an output near-end to an output far-end of the gate line (the direction indicated by the arrow in FIG. 3, i.e., a direction of the gate line away from a scanning signal driving circuit).

In a liquid crystal display panel, a liquid crystal layer between an array substrate and a color filter substrate can be equivalent to a liquid crystal capacitance. It can be seen from an expression of a voltage drop on a gate line that a liquid crystal capacitance $C_{lc}$ affects a voltage drop $\Delta Vp$. With values of other parameters being the same, the greater the liquid crystal capacitance $C_{lc}$ is, the smaller the voltage drop $\Delta Vp$ is. Liquid crystal capacitance $C_{lc}$=Dielectric Constant*Inter-electrode area/Inter-electrode distance. That is, the longer a distance between two electrodes of the liquid crystal capacitance is, the greater the voltage drop $\Delta Vp$ is; and on the contrary, the shorter the distance between two electrodes of the liquid crystal capacitance is, the smaller the voltage drop $\Delta Vp$ is. Thus, along the direction from the output near-end to the output far-end of the gate line, gradually decreasing of the distance between two electrodes of the liquid crystal capacitance can cause gradually decreasing of the voltage drop $\Delta Vp$ along the direction from the output near-end to the output far-end of the gate line. In this way, $\Delta Vp$ across the gate line from the output near-end to the output far-end of the gate line can be kept nearly the same by adjusting the distance between the two electrodes of the liquid crystal capacitance (i.e., the thickness of the liquid crystal layer). Accordingly, voltages output from respective parts of the panel can become uniform, and display uniformity of a panel can be improved.

In one embodiment of the present disclosure, the display panel further comprises spacers. The spacers are disposed between the array substrate and the color filter substrate. The spacers are configured to have heights decreasing along the direction from the output near-end to the output far-end of the gate line. Specifically, spacers are generally disposed between the array substrate and the color filter substrate, and are fixed on a side of the color filter substrate to serve as a supporting element in order to keep a distance between the array substrate and the color filter substrate constant. However, in the present disclosure, heights of spacers 121 decrease along the direction from the output near-end to the output far-end of the gate line, which causes the distance between the array substrate and the color filter substrate to decrease along the direction from the output near-end to the output far-end of the gate line. Accordingly, the thickness of the liquid crystal layer gradually decreases along the direction from the output near-end to the output far-end of the gate line. This is shown in FIG. 4.

In one embodiment of the present disclosure, the spaces are formed by irradiating a negative photoresist through a photomask provided thereon with chromium films which have various thicknesses and are disposed at preset light-transmitting positions. Specifically, as shown in FIG. 4, spacers 121, heights of which gradually decrease along the direction from the output near-end to the output far-end of the gate line, are formed by irradiating a negative photoresist through a photomask 21 as shown in FIG. 4. In the present disclosure, spacers are formed of a negative photoresist material. After the negative photoresist material is subjected to an exposure treatment, solubility of a portion thereof exposed to light is clearly different from solubility of a portion thereof unexposed to light. The unexposed portion of the photoresist material is dissolved, and the exposed portion of the photoresist material is left to serve as spacers. Preset light-transmitting positions on the photomask 21 correspond to portions of the photoresist material that are exposed to light. Chromium films of various thicknesses are disposed at the preset light-transmitting positions. Chromium films having different thicknesses transmit different amounts of light, and a thicker chromium film transmits less light.

Figure 4:
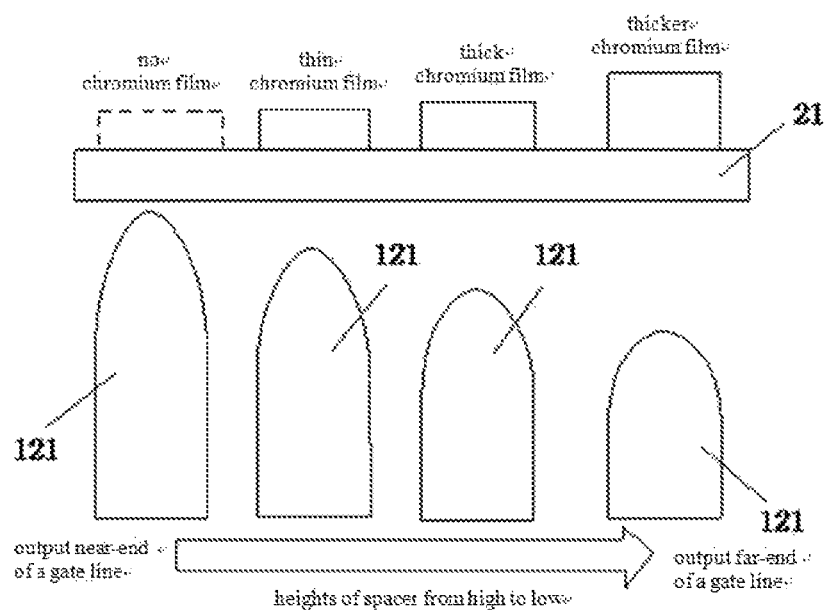
FIG. 4 schematically shows a structure of a photomask and gradual changing of heights of corresponding spacers according to one embodiment of the present disclosure.

To form a spacer having a largest height, a chromium film at a corresponding position can be arranged to have a smallest thickness, or no chromium film is arranged at the corresponding position (as shown in FIG. 4). Then, the chromium films are configured to have successively increasing thicknesses along the direction from the output near-end to the output far-end of the gate line. In this way, a spacer formed close to the output near-end is the highest, and a spacer formed close to the output far-end is the lowest. The final height layout of the spacers is shown in FIG. 4.

In one embodiment of the present disclosure, the spacers are formed by adjusting quantities of a spacer material sprayed at preset positions on the color filter substrate, or the spacers are formed by adjusting distances between a nozzle for spraying the spacer material and the preset positions on the color filter substrate or adjusting speeds at which the nozzle sprays the spacer material. Specifically, during coating of the spacer material on the preset positions on the color filter substrate 12, the quantity of the spacer material sprayed can be adjusted. Larger quantities of the spacer material sprayed at positions close to the output near-end of the gate line result in higher spacers, and less quantities of the spacer material sprayed at positions away from the output near-end of the gate line result in lower spacers. Heights of eventually formed spacers are shown in FIG. 4. Alternatively, during coating of the spacer material on the preset positions on the color filter substrate, a distance between a nozzle for spraying the spacer material and a glass substrate can be adjusted, or the speed at which the nozzle sprays the spacer material can be adjusted. At a position close to the output near-end of the gate line, the distance is shorter or the speed is slower, and the spacer formed is higher. At a position distant from the output near-end of the gate line, the distance is longer or the speed is faster, and the spacer formed is lower. Heights of eventually formed spacers are shown in FIG. 4.

The spacers are used for supporting the array substrate and the color filter substrate. Thus, in order to keep the distance between the array substrate and the color filter substrate constant, two spacers at two endpoints along the direction from the output near-end to the output far-end of the gate line should be configured to have a height difference not larger than 0.2 μm so as to avoid an influence on image display of a panel.

Figure 5:
FIG. 5 schematically shows a structure of a black matrix on a color substrate according to one embodiment of the present disclosure.

In one embodiment of the present disclosure, the display panel further comprises a black matrix. The black matrix is disposed on the color filter substrate. The black matrix is configured to have a thickness gradually increasing along the direction from the output near-end to the output far-end of the gate line. The black matrix is generally disposed on the color filter substrate for separating color resist layers of the color filter substrate and avoiding generation of a photocurrent. Besides, the spacers are also generally arranged on the black matrix. In the present disclosure, the black matrix 122 is arranged to have a thickness increasing along the direction from the output near-end to the output far-end of the gate line, which is shown in FIG. 5. In this way, the thickness of the black matrix gradually increase along the direction from the output near-end to the output far-end of the gate line, so that the thickness of the liquid crystal layer gradually decreases along the direction from the output near-end to the output far-end of the gate line.

In one embodiment of the present disclosure, the black matrix is formed by adjusting a quantity of a black matrix material sprayed at a preset position on the color filter substrate, or the black matrix is formed by adjusting a distance between a nozzle for spraying the black matrix material and the preset position on the color filter substrate or adjusting a speed at which the nozzle sprays the black matrix material. Specifically, the black matrix with a gradually changing thickness can be formed by a same method for coating the spacer material. The details will not be described.

Figure 6:
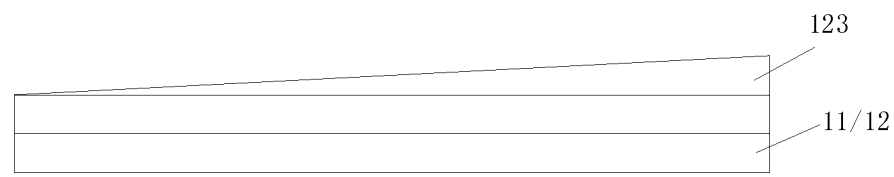
FIG. 6 schematically shows a structure of an alignment layer at a side of a color filter substrate or at a side of the array substrate according to one embodiment of the present disclosure.

In one embodiment of the present disclosure, the display panel further comprises a first alignment layer disposed at a side of the array substrate close to the liquid crystal layer and a second alignment layer disposed at a side of the color filter substrate close to the liquid crystal layer. The first alignment layer or the second alignment layer is configured to have a thickness gradually increasing along the direction from the output near-end to the output far-end of the gate line. In a liquid crystal display panel, a side of the array substrate close to the liquid crystal layer and a side of the color filter substrate close to the liquid crystal layer each are usually provided with an alignment layer 123 for orientation and alignment of liquid crystal molecules in the liquid crystal layer. In the present disclosure, as shown in FIG. 6, a thickness of the first alignment layer or a thickness of the second alignment layer is arranged to gradually increase along the direction from the output near-end to the output far-end of the gate line. The thicker the alignment layer 123 is, the thinner a liquid crystal cell is. In this way, the thickness of the liquid crystal layer is made to gradually decrease along the direction from the output near-end to the output far-end of the gate line. Besides, both the thickness of the first alignment layer and the thickness of the second alignment layer can be arranged to gradually increase along the direction from the output near-end to the output far-end of the gate line, and the present disclosure is not limited thereto.

Figure 7:
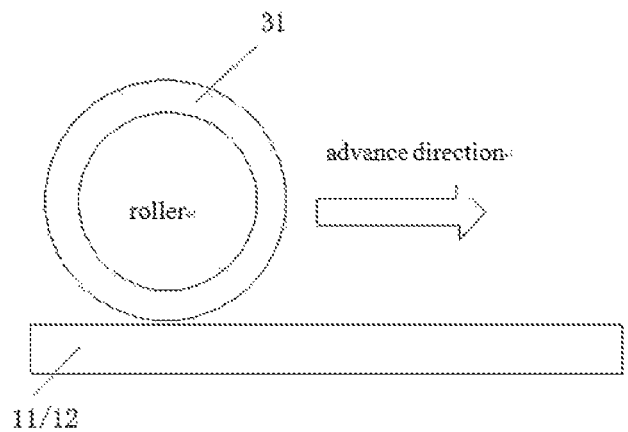
FIG. 7 schematically shows transferring an alignment material with a printing plate according to one embodiment of the present disclosure.
Figure 8:
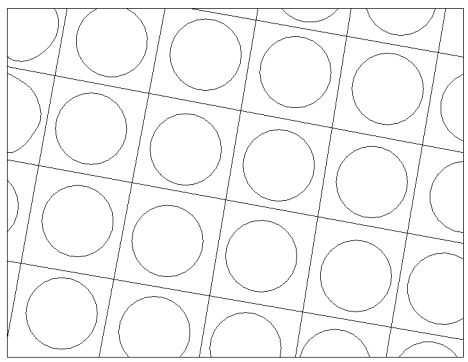
FIG. 8 schematically shows holes of the printing plate according to one embodiment of the present disclosure.

In one embodiment of the present disclosure, the first alignment layer or the second alignment layer is formed by transferring an alignment material to the array substrate or the color filter substrate with a printing plate which is provided thereon with holes of various sizes. Generally, an APR plate is used as a printing plate 31. The printing plate 31 is disposed on a roller, and is configured to transfer the alignment material to the array substrate or the color filter substrate, which is shown in FIG. 7. The APR plate is an uneven plate made of an ultraviolet-curable polyurethane resin, and has holes on its surface, which is shown in FIG. 8. A solution of an alignment layer material is filled in areas between holes. For bigger holes, less solution is filled between the holes, and for smaller holes, more solution is filled between the holes. After being coated on the APR plate, the solution of the alignment layer material can be coated on the array substrate and the color filter substrate by means of a transfer technique.

Figure 9:
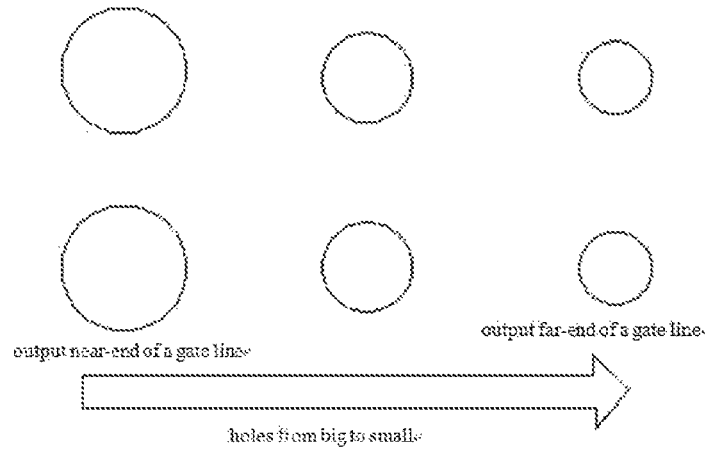
FIG. 9 schematically shows gradual changing of holes of the printing plate according to one embodiment of the present disclosure.

In one embodiment of the present disclosure, the sizes of the holes on the printing plate gradually decrease along the direction from the output near-end to the output far-end of the gate line. Specifically, as is shown in FIG. 9, along the direction from the output near-end to the output far-end of the gate line, holes close to the output near-end of the gate line are bigger, less solution of the alignment layer material is filled therebetween, and the alignment layer is thinner; and holes close to the output far-end of the gate line are smaller, more solution of the alignment layer material is filled therebetween, and the alignment layer is thicker.

According to another aspect of the present disclosure, a display device, which comprises the abovementioned display panel, is further provided. Specifically, the display panel comprises an array substrate, a color filter substrate, and a liquid crystal layer. A plurality of parallel gate lines is disposed on the array substrate. The liquid crystal layer is disposed between the array substrate and the color filter substrate. The liquid crystal layer is configured to have a thickness gradually decreasing along a direction from an output near-end to an output far-end of the gate line.

In one embodiment of the present disclosure, the display panel further comprises spacers. The spacers are disposed between the array substrate and the color filter substrate. The spacers are configured to have heights decreasing along the direction from the output near-end to the output far-end of the gate line.

In one embodiment of the present disclosure, the display panel further comprises a black matrix. The black matrix is disposed on the color filter substrate and has a thickness gradually decreasing along the direction from the output near-end to the output far-end of the gate line.

In one embodiment of the present disclosure, the display panel further comprises a first alignment layer disposed at a side of the array substrate close to the liquid crystal layer and a second alignment layer disposed at a side of the color filter substrate close to the liquid crystal layer. A thickness of the first alignment layer or the second alignment layer gradually increases along the direction from the output near-end to the output far-end of the gate line.

Although the embodiment of the present disclosure are provided as above, the above embodiment are described only for better understanding, rather than restricting the present disclosure. Anyone skilled in the art can make amendments or changes to the implementing forms or details without departing from the spirit and scope of the present disclosure. The scope of the present disclosure should be subject to the scope defined in the claims.

The invention claimed is:

1. A display panel, comprising:
an array substrate provided thereon with a plurality of parallel gate lines;
a color filter substrate; and
a liquid crystal layer, which is disposed between the array substrate and the color filter substrate,
wherein the liquid crystal layer is configured to have a thickness gradually decreasing along a direction from an output near-end to an output far-end of the gate line in one of following ways that:
the display panel further comprises spacers disposed between the array substrate and the color filter substrate, and the spacers are configured to have heights gradually decreasing along the direction from the output near-end to the output far-end of the gate line; or
the display panel further comprises a black matrix disposed on the color filter substrate, and the black matrix is configured to have a thickness gradually increasing along the direction from the output near-end to the output far-end of the gate line; or
the display panel further comprises a first alignment layer disposed at a side of the array substrate close to the liquid crystal layer and a second alignment layer disposed at a side of the color filter substrate close to the liquid crystal layer, and the first alignment layer or the second alignment layer is configured to have a thickness gradually increasing along the direction from the output near-end to the output far-end of the gate line.

2. The display panel according to claim 1, wherein the spacers are formed by irradiating a negative photoresist through a photomask provided thereon with chromium films which have various thicknesses and are disposed at preset light-transmitting positions.

3. The display panel according to claim 1, wherein the spacers are formed by adjusting quantities of a spacer material sprayed at preset positions on the color filter substrate, or the spacers are formed by adjusting distances between a nozzle for spraying the spacer material and the preset positions on the color filter substrate or adjusting speeds at which the nozzle sprays the spacer material.

4. The display panel according to claim 1, wherein the black matrix is formed by adjusting a quantity of a black matrix material sprayed at a preset position on the color filter substrate, or the black matrix is formed by adjusting a distance between a nozzle for spraying the black matrix material and the preset position on the color filter substrate or adjusting a speed at which the nozzle sprays the black matrix material.

5. The display panel according to claim 1, wherein the first alignment layer or the second alignment layer is formed by transferring an alignment material to the array substrate or the color filter substrate with a printing plate which is provided thereon with holes of various sizes.

6. The display panel according to claim 5, wherein the holes on the printing plate are configured to have sizes gradually decreasing along the direction from the output near-end to the output far-end of the gate line.

7. A display device, comprising a display panel, wherein the display panel comprises:
an array substrate provided thereon with a plurality of parallel gate lines;
a color filter substrate; and
a liquid crystal layer, which is disposed between the array substrate and the color filter substrate,
wherein the liquid crystal layer is configured to have a thickness gradually decreasing along a direction from an output near-end to an output far-end of the gate line in one of following ways that:
the display panel further comprises spacers disposed between the array substrate and the color filter substrate, and the spacers are configured to have heights gradually decreasing along the direction from the output near-end to the output far-end of the gate line; or
the display panel further comprises a black matrix disposed on the color filter substrate, and the black matrix is configured to have a thickness gradually increasing along the direction from the output near-end to the output far-end of the gate line; or
the display panel further comprises a first alignment layer disposed at a side of the array substrate close to the liquid crystal layer and a second alignment layer disposed at a side of the color filter substrate close to the liquid crystal layer, and the first alignment layer or the second alignment layer is configured to have a thickness gradually increasing along the direction from the output near-end to the output far-end of the gate line.

8. The display device according to claim 7, wherein the spacers are formed by irradiating a negative photoresist through a photomask provided thereon with chromium films which have various thicknesses and are disposed at preset light-transmitting positions.

9. The display device according to claim 7, wherein the spacers are formed by adjusting quantities of a spacer material sprayed at preset positions on the color filter substrate, or the spacers are formed by adjusting distances between a nozzle for spraying the spacer material and the preset positions on the color filter substrate or adjusting speeds at which the nozzle sprays the spacer material.

10. The display device according to claim 7, wherein the black matrix is formed by adjusting a quantity of a black matrix material sprayed at a preset position on the color filter substrate, or the black matrix is formed by adjusting a distance between a nozzle for spraying the black matrix material and the preset position on the color filter substrate or adjusting a speed at which the nozzle sprays the black matrix material.

11. The display device according to claim 7, wherein the first alignment layer or the second alignment layer is formed by transferring an alignment material to the array substrate or the color filter substrate with a printing plate which is provided thereon with holes of various sizes.

12. The display device according to claim 11, wherein the holes on the printing plate are configured to have sizes gradually decreasing along the direction from the output near-end to the output far-end of the gate line.

\* \* \* \* \*